US006877211B2

(12) United States Patent
Machado

(10) Patent No.: US 6,877,211 B2
(45) Date of Patent: *Apr. 12, 2005

(54) METHOD OF MANUFACTURING AN IMPROVED MICROELECTRONIC PACKAGE

(75) Inventor: Russell Lee Machado, San Diego, CA (US)

(73) Assignee: Pulse Engineering, Inc., San Diego, CA (US)

(*) Notice: Subject to any disclaimer, the term of this patent is extended or adjusted under 35 U.S.C. 154(b) by 727 days.

This patent is subject to a terminal disclaimer.

(21) Appl. No.: 09/794,263

(22) Filed: Feb. 27, 2001

(65) Prior Publication Data

US 2001/0008044 A1 Jul. 19, 2001

Related U.S. Application Data

(62) Division of application No. 09/163,871, filed on Sep. 30, 1998, now Pat. No. 6,225,560.
(60) Provisional application No. 60/066,278, filed on Nov. 25, 1997.

(51) Int. Cl.$^7$ ................................................ H01F 7/06
(52) U.S. Cl. ........................ 29/602.1; 29/592.1; 29/606; 29/831; 174/52.2; 336/92; 361/782
(58) Field of Search .......................... 29/605, 606, 850, 29/830–834, 854, 827, 592.1, 602.1; 257/E23.043; 174/52.2; 336/96, 92, 90; 361/782, 883, 836, 807, 809

(56) References Cited

U.S. PATENT DOCUMENTS

| | | | | | |
|---|---|---|---|---|---|
| 5,015,981 | A | * | 5/1991 | Lint et al. | 336/65 |
| 5,425,166 | A | * | 6/1995 | Hastings et al. | 29/602.1 |
| 5,455,741 | A | * | 10/1995 | Wai et al. | 361/761 |
| 6,225,560 | B1 | * | 5/2001 | Machado | 174/52.2 |
| 6,642,827 | B1 | * | 11/2003 | McWilliams et al. | 29/602.1 |
| 6,691,398 | B1 | * | 2/2004 | Gutierrez | 29/592.1 |

* cited by examiner

Primary Examiner—Minh Trinh
(74) Attorney, Agent, or Firm—Knobbe Martens Olsen & Bear LLP

(57) ABSTRACT

A method of making a microelectronic package. The advanced microelectronic component package incorporates a specially shaped base element which holds and electrically separates the individual conductors associated with the microelectronic component(s) so that the individual conductors may be bonded to external package leads and other conductors within the package. In a first embodiment, jacketed, insulated wire is used as one winding of a toroidal transformer, while unjacketed insulated wire is used as another winding. The jacketing is stripped from the first winding and the exposed conductors are routed into channels along the sides of the base element. The unjacketed conductors are also routed into the same channels, where both conductors are bonded to the external package leads. Raised elements along the sides of the base provide the required electrical separation between the conductors during both manufacture and operation. A method of manufacturing the improved microelectronic package is also disclosed.

8 Claims, 10 Drawing Sheets

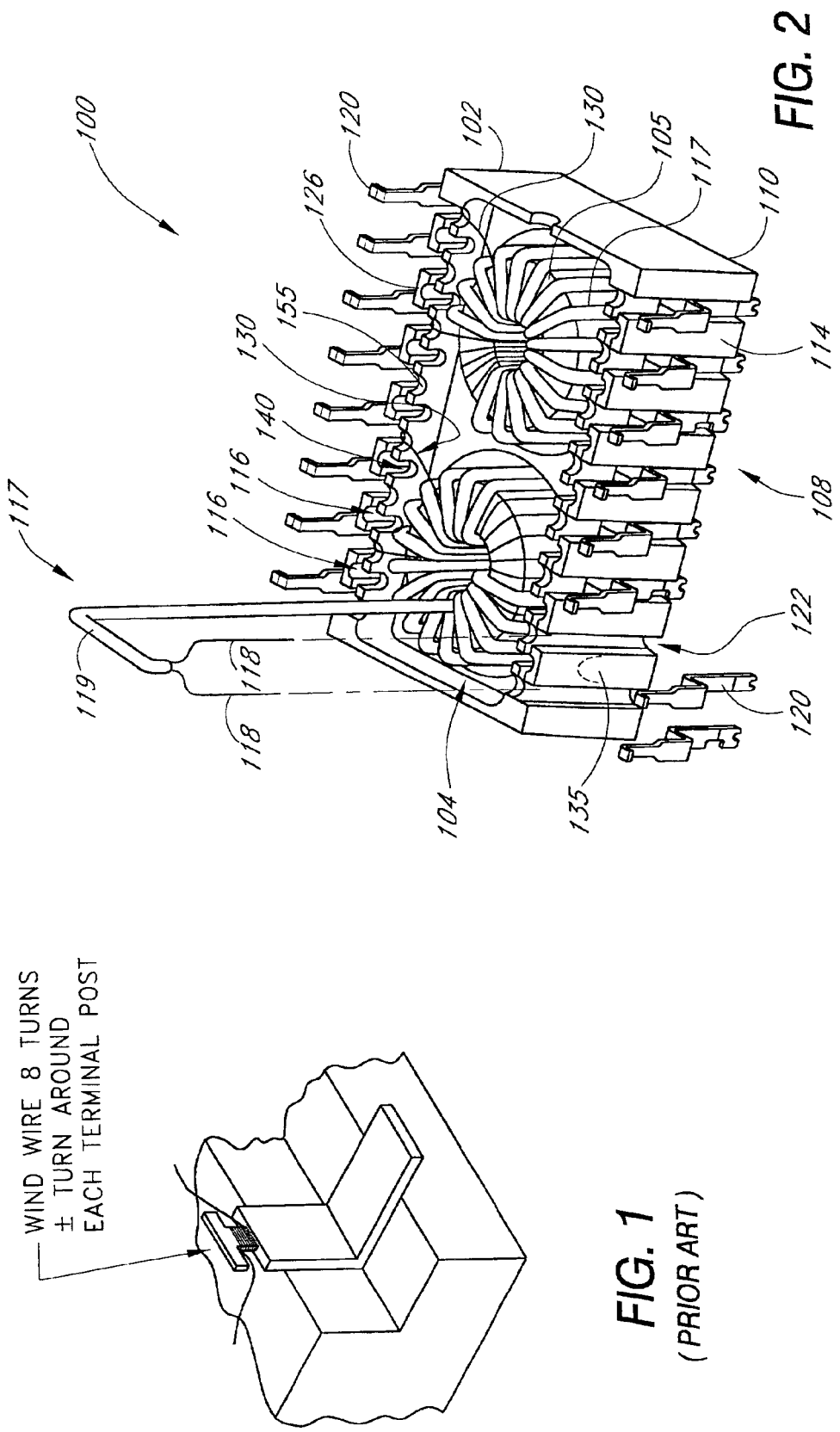

METHOD OF MANUFACTURING AN IMPROVED MICROELECTRONIC PACKAGE

RELATED APPLICATION

This application is a divisional of U.S. patent application entitled "ADVANCED ELECTRONIC MICROMINATURE PACKAGE AND METHOD" having application Ser. No. 09/163,871, filed on Sep. 30, 1998, now U.S. Pat. No. 6,225,560, issued May 1, 2001 which claims the benefit of provisional application Ser. No. 60/066,278, filed on Nov. 25, 1997.

BACKGROUND OF THE INVENTION

1. Field of the Invention

The present invention relates generally to microminiature electronic elements and particularly to an improved package and method of packaging for microminiature electronic components.

2. Description of Related Technology

For many years, electronic circuit boards have been fabricated by interconnecting a plurality of electronic components, both active and passive, on a planar printed circuit board. Typically, this printed circuit board has comprised an Epoxy/fiberglass laminate substrate clad with a sheet of copper, which has been etched to delineate the conduct paths. Holes were drilled through terminal portions of the conductive paths for receiving electronic component leads which were subsequently soldered thereto.

More recently, so-called surface mount technology has evolved to permit more efficient automatic mass production of circuit boards with higher component densities. With this approach, certain packaged components are automatically placed at preselected locations on top of a printed circuit board so that their leads are registered with, and lie on top of, corresponding solder paths. The printed circuit board is then processed by exposure to infrared, convection oven or vapor phase soldering techniques to re-flow the solder and, thereby, establish a permanent electrical connection between the leads and their corresponding conductive paths on the printed circuit board.

Dual in-line chip carriers are a well known embodiment of microelectronic component packages which have existed for many years. The most common example is an integrated circuit which is bonded to a ceramic carrier and electrically connected to a lead frame providing opposite rows of parallel electrical leads. The integrated circuit and ceramic carrier are normally encased in a rectangular plastic housing from which the leads extend. Typically, these dual in-line packages are mounted horizontally, i.e. with the leads extending co-planar with the printed circuit board. Such dual in-line packages have heretofore been attached to printed circuit boards by surface mounting techniques.

The increasing miniaturization of electrical and electronic elements and the high density mounting of such elements has created increasing problems with electrical isolation and mechanical interconnection. In particular, miniaturization and high density placement makes it more difficult to establish reliable and efficient connection between fine gauge (AWG 20 to AWG 50) copper wires and egress hardware or terminals. Presently known interconnection methods severely limit the ability to provide high density and reliable electrical and mechanical isolation between distinct egress or terminal points due to space limitations.

One prior art interconnection approach, as illustrated in FIG. 1, is to extend a fine copper wire forming the element lead and to wrap or coil it around a terminal pin of a terminal and apply solder to the connection. This configuration requires space that is not always available and does not allow adequate separation for high voltages that may be required in the circuit. Another problem with this approach is that element leads are frequently broken or sheared during a subsequent encapsulation process. In addition, the lead is also frequently broken as the result of thermal expansion and contraction of the leads and/or terminals. For reasons discussed further below, this method is particularly unsuitable when microelectronic transformers are used within the component package. Transformers are electrical components which are used to transfer energy from one alternating current (AC) circuit to another by magnetic coupling. Generally, transformers are formed by winding one or more wires around a ferrous core. A first wire acts as a primary winding and conductively couples energy to and from a first circuit. A second wire, also wound around the core so as to be magnetically coupled with the first wire, acts as a secondary winding and conductively couples energy to and from a second circuit. AC energy applied to the primary windings causes AC energy in the secondary windings and vice versa. A transformer may be used to transform between voltage magnitudes or current magnitudes, to create a phase shift, and to transform between impedance levels.

Another purpose for which microelectronic transformers may be used is to provide physical isolation between two circuits. For example, a transformer may be used to provide isolation between a telephone signal line in the public switched telephone network and consumer equipment such as modems, computers and telephones. The transformer must be able to withstand large voltage spikes which may occur due to lightning strikes, malfunctioning equipment, and other real-world conditions without causing a risk of electrical fire or other hazardous conditions.

One well-known configuration for a microelectronic transformer comprises a toroidal ferrous core. A toroidal transformer can elegantly provide any one of the above listed functions. One drawback to the use of toroidal cores relates to manufacturing; such cores are not easily manufactured nor are the resulting transformers in a convenient configuration for modem component package production techniques. Additional information about electronic microminiature packaging can be found in U.S. Pat. No. 5,015,981 entitled "ELECTRONIC MICROMINIATURE PACKAGING AND METHOD" which is assigned to the assignee hereof, and incorporated by reference herein in its entirety.

In addition to physical and manufacturing considerations, the electrical performance of the transformer must be considered. One means by which the electrical performance of transformers is gauged is the high-potential (hi-pot) test. A hi-pot test involves the application of AC or DC signals to the transformer to determine whether the breakdown of the core dielectric or other destructive failures occur at some chosen voltage level. A hi-pot test can also be used to demonstrate that insulation can withstand a given over-voltage condition and to detect weak spots in the insulation that could later result in in-service failures.

The International Electro-Technical Committee is an international standards body which develops the standards by which isolation transformers are categorized according to performance level. For example, UL-1950 and its corresponding national adaptations specify a minimum standard for dielectric breakdown between the primary and secondary windings of a transformer. In order to meet such a standard, it is critical that the primary and secondary windings are electrically isolated from one another while remaining magnetically coupled to one another through the transformer core.

In order to provide such electrical isolation between the primary and secondary windings, special jacketing materials have been developed to encase one or both of the primary and secondary windings. For example, UL-1950 specifies that one winding is covered with three layers of insulation material for which all combinations of two layers together pass a specified electric strength test. The second winding may be enameled copper magnet wire. The wire covered in a protective extrusion or jacket comprising three layers of insulation is referred to as reinforced insulated or jacketed wire. The protective jacket provides electrical isolation which inhibits dielectric breakdown between the windings at extended voltage ranges. One example of jacketed wiring is that manufactured by the Rubadue Wire Co. of Fontana, Calif. and incorporated in Pulse Engineering, Inc. part number 054-XIXWXXX-X.

The protective jacket provides insulation between the wires so long as it is in place. But in order to conductively connect the insulated conductors to external elements during the manufacturing process, a portion of the conductors must be exposed by removal of the protective jacket. The exposed conductors are not immune from dielectric breakdown and other phenomenon which may decrease the isolation performance of the resulting transformer. Isolation between the exposed conductors and the remainder of the transformer such as the ferrous core and the second winding must be accomplished by some other means. UL-1950 specifies that the additional isolation is accomplished by physical separation between the exposed conductors and other transformer elements. For example, UL-1950 specifies that the exposed portion of the conductors should be separated from the bare core and the second windings by at least 0.4 millimeters (mm) or approximately 0.016 in. (16 mils).

One difficulty related to the incorporation of jacketed insulated wire into a dual in-line surface mount package is maintaining the 0.4 mm clearance in a repeatable and consistent manner. The jacketed wire resists bending and may tend to spring back and, thus, move after placement. In the manufacturing environment, the assembly of packaged electronic elements is carried out in stages. In order for manufacturing to produce conforming parts, it is important that the previously assembled components remain properly in place while waiting for and during execution of additional manufacturing steps. In this case, if the wires move from the desired position, the parts may not conform to the requirements (such as the aforementioned requirement of 16 mils of spacing).

Based on the foregoing, it would be desirable to provide an improved microelectronic component surface mount package and method of manufacturing. Such an improved package would provide a guaranteed separation between the exposed conductors and other component elements and also provide a locking feature to hold the jacketed wire in place during the manufacturing process, thereby allowing for a more uniform and reliable product.

SUMMARY OF THE INVENTION

The present invention satisfies the aforementioned needs by providing an improved microelectronic component base and package, and method of manufacturing the same.

A first aspect of the invention comprises an improved microelectronic component base for use within an encapsulated component package. One embodiment, the base includes one or more internal recesses adapted to receive a microelectronic component, and an external sidewall. The sidewall incorporates a series of peripheral raised elements that each cooperate with the sidewall and a respective locking element so as to guide and retain the conductors of the microelectronic component during manufacture of the component package. The raised elements are each comprised of an outer wall and tapered divider; the outer wall, divider, and base sidewall cooperating to form a cavity within which the microelectronic component conductors are received. This arrangement secures the conductors during manufacture and further provides reliable and effective electrical separation for the conductors during manufacture and operation of the package.

A second aspect of the invention comprises an improved microelectronic component package incorporating the aforementioned component base. The package includes one or more microelectronic components (transformers in one embodiment) having both jacketed and unjacketed conductors wound thereon. The jacketing of the former is removed in the region of the base element sidewall to expose the underlying insulated conductors, which are routed through the channels of the base. A series of electrical leads are inserted in channels formed between adjacent raised elements so as to form an electrical connection with the individual transformer conductors. The base with installed transformer(s), conductors, and a portion of the electrical leads are ultimately encapsulated in a polymer to form the finished component package.

A third aspect of the invention comprises a circuit board incorporating the aforementioned microelectronic package.

A fourth aspect of the invention comprises an improved method of manufacturing the microelectronic component package of the present invention. The method is comprised generally of the steps of (1) winding a toroidal transformer core with a plurality of conductors, at least some of which are jacketed; (2) forming a base element with a recess as described above, (3) stripping the jacketing from a portion of the conductors in the vicinity of the base element; (4) inserting and retaining one or more of the wound toroidal transformer cores within the recess of the base element, (5) routing the jacketed conductors through the locking elements and raised elements of the base to provide mechanical restraint; (6) routing the exposed conductors through the channels of the base to provide electrical separation; (7) inserting electrical leads into the channels formed between the raised elements of the base; (8) bonding the electrical leads and exposed conductors within each channel together; and (9) encapsulating the base, toroidal core, conductors and a portion of the electrical leads to seal the package and maintain the relative positions of the aforementioned components.

BRIEF DESCRIPTION OF THE DRAWINGS

The features, objectives, and advantages of the invention will become more apparent from the detailed description set forth below when taken in conjunction with the drawings, wherein:

FIG. 1 is a perspective view illustrating a prior art configuration and method for attaching electrical conductors to lead posts.

FIG. 2 is a perspective view illustrating major components of a first embodiment of the microelectronic component package of the present invention.

DETAILED DESCRIPTION OF THE PREFERRED EMBODIMENT

Figure 3:
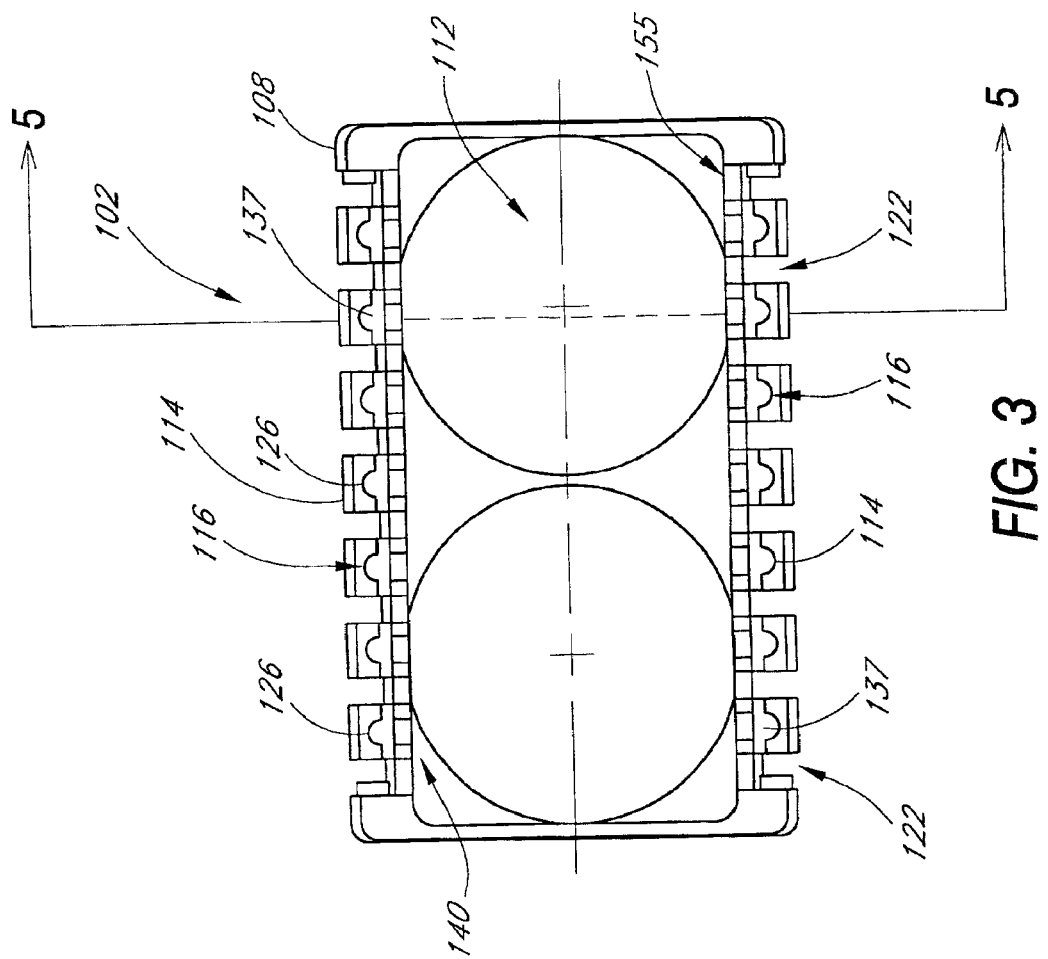
FIGS. 3 and 4 are top and side views, respectively, of the microelectronic component base contained within the component package of FIG. 2.

Reference is now made to the drawings wherein like numerals refer to like parts throughout.

Referring now to FIG. 2, a first embodiment of the microelectronic component package of the present invention is illustrated. The component package 100 is generally comprised of a base element 102, one or more microelectronic components 104, and a series of package electrical leads 120. The finished device also includes an outer encapsulating covering (not shown in FIG. 2; see discussion of FIGS. 7 through 9 below). In the present embodiment, the microelectronic components 104 are two toroidal transformers as previously described, although it can be appreciated that other components (such as choke coils or inductors) may be used within the package, either alone or in combination. The construction and manufacture of such microelectronic components are well known in the art, and accordingly will not be described further herein, except as with respect to the jacketed electrical wire 117 utilized in conjunction with the component(s) 104; see detailed discussion below.

Referring again to FIG. 2, the base element 102 generally includes one or more sidewalls 108, a bottom surface 110, and one or more recesses 112 which are adapted to receive the aforementioned microelectronic component(s) 104 during assembly. Note that the package 100 is typically inverted from the orientation shown in FIG. 2 when mounted on an external device (see, for example, FIG. 9); hence, the "bottom" surface 110 in actuality becomes the "top" surface when the package is installed. The base element 102 of the present embodiment further includes a plurality of raised elements 114 which are integrally formed with the sidewalls 108 in a vertical orientation adjacent to one another. As will be described in greater detail below, the raised elements provide four primary functions: (1) assist in the formation of a cavity 116 between the raised element 114 and the sidewall 108, this cavity being designed to receive the jacketed wire 117 associated with the microelectronic component(s) 104; (2) route and separate the individual conductors 118 of the jacketed wire 117 received by the aforementioned cavity 116 so as to provide electrical isolation; (3) receive the individual conductors 118 and unjacketed wire 130 from the microelectronic component 104 within the channels 122 formed by adjacent raised elements 114, and (4) receive electrical leads 120 within channels 122 so as to facilitate electrical contact between the individual conductors 118, unjacketed wire 130, and the electrical leads 120.

The base element 102 is preferably constructed of a suitable molded non-conducting material; for example, a high temperature liquid crystal polymer such as that available under the part number RTP 3407-4 from the RTP Company of Winona, Minn. may be used. It will be recognized, however, that a variety of other insulative materials may be used to form the base element, depending on the needs of the specific application.

Referring again to FIG. 2, a jacketed wire 117 is wound about the toroid core 105. The jacketed wire 117 houses two individual insulated conductors 118 within a reinforced insulation extrusion or jacket 119. The number of conductors 118 and the configuration in which they are electrically connected depends upon the desired transform characteristics. A variety of configurations are possible in accordance with the invention. The individual conductors 118 are exposed by removing a portion of the jacket 119 during manufacture of the transformer component 104.

The jacketed wire 117 used in the present embodiment may be the aforementioned RUBADUE wire having a Teflon™ or Tefzel™ fluoropolymer jacket and insulated conductors 118, or may be an alternate construction and composition, so long as the desired electrical performance is maintained.

Also shown in FIG. 2 is a unjacketed wire 130 (insulated "magnet" wire in the present embodiment) which is wound about the toroid core 105. Also, along the upper edges of the base 102, is a series of sidewall interstices 155. When the package 100 is assembled, the unjacketed wire 130 is disposed through one of the interstices 155 and directly into the lead channels 122. A portion of any insulation on the unjacketed wire 130 which extends into the channel 122 is ultimately removed during solder bonding so that a permanent electrical connection may be made between the unjacketed wire 130 and a respective one of the package leads 120.

Figure 4:
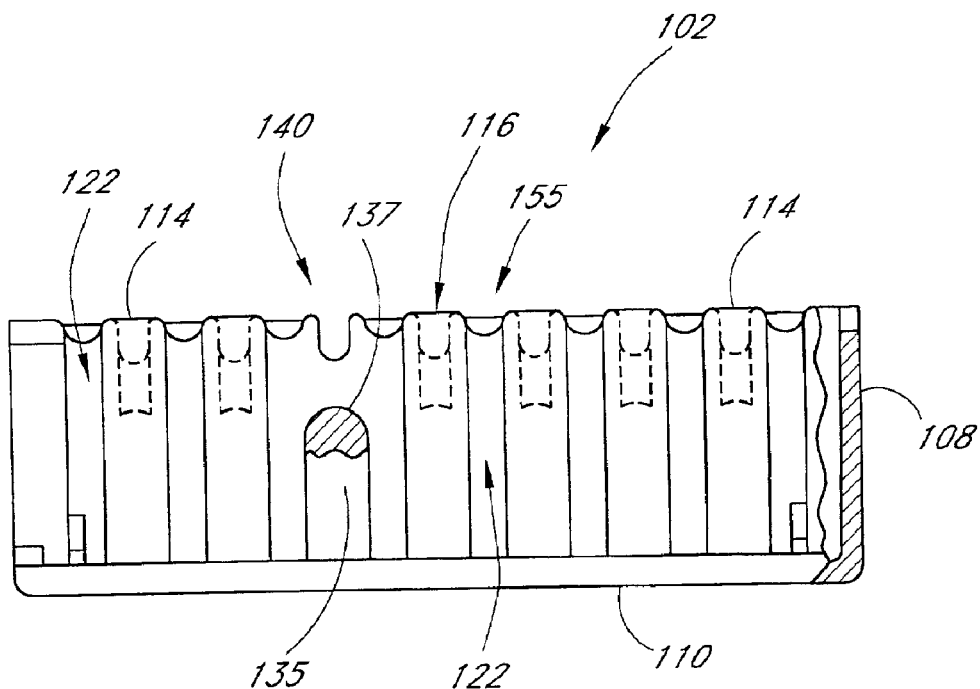
Figure 5:
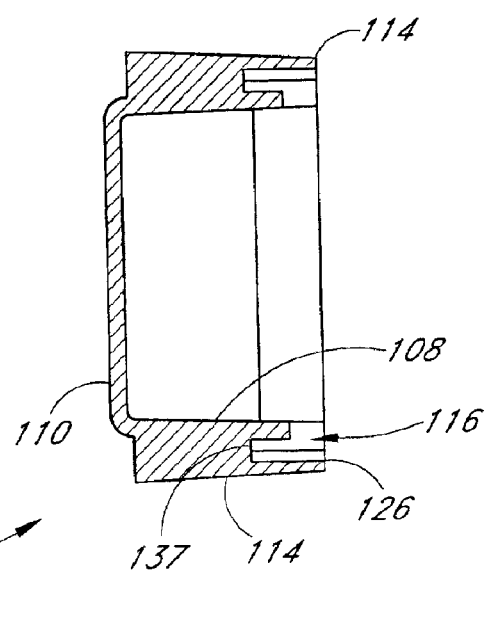
FIG. 5 is a front cross-sectional view of the microelectronic component base contained within the component package of FIG. 2, taken along 5—5 of FIG. 3.
Figure 6:
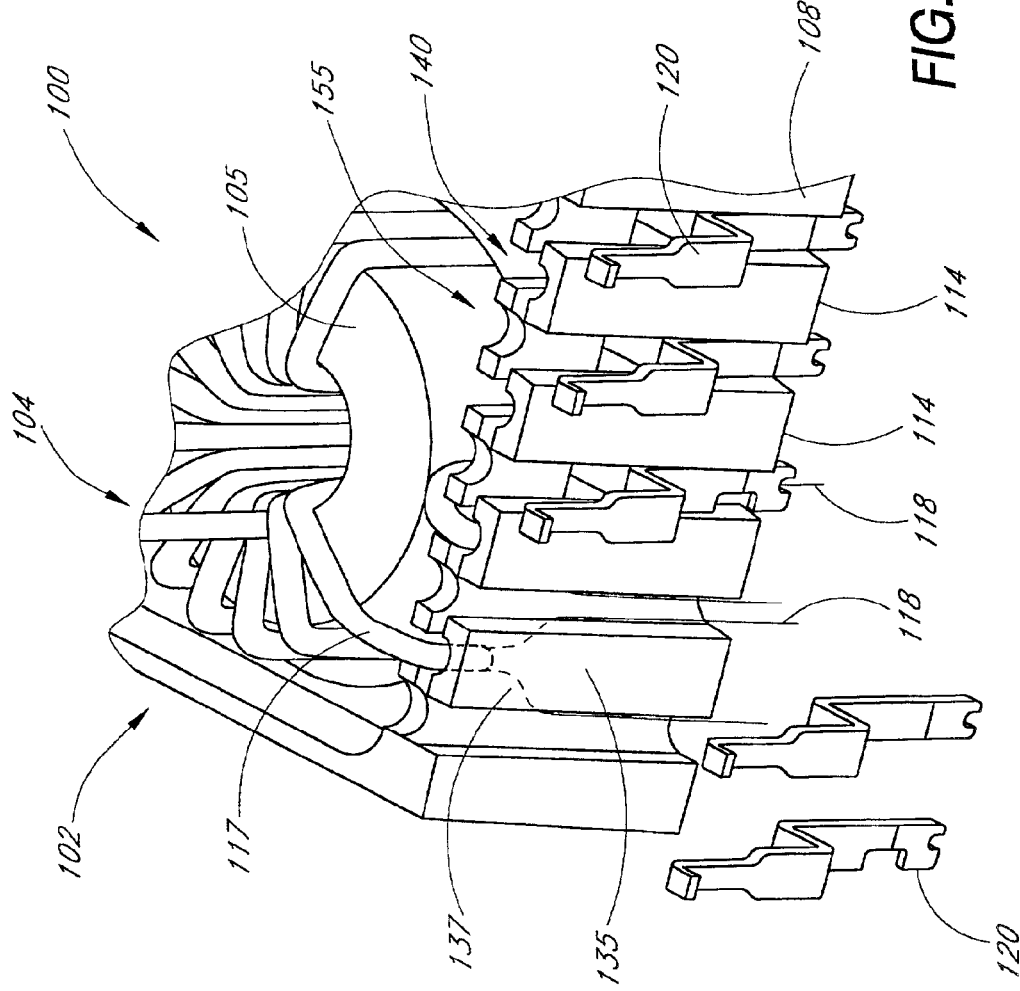
FIG. 6 is a partial perspective view of the component package of FIG. 2 illustrating the relationship between the reinforced insulated wire, raised element, cavity, and electrical leads during assembly.

FIGS. 3–6 illustrate the construction of the base element 102 in greater detail. FIG. 3 is a top view illustrating the cavities 116 formed between the raised elements 114 and their respective sidewalls 108. In the present embodiment, the inner surface of the top portion 124 of the raised element 114 includes a semicircular recess 126 which is useful in receiving the common jacket 119 of the individual conductors 118. The channels 122 formed between adjacent raised elements 114 are also clearly visible in FIGS. 3, 4, and 6. These channels 122 receive the electrical leads 120, and the conductors 118 and unjacketed wire 130 associated with the microelectronic components 104, and allow for electrical connection thereof via soldering or other bonding process as shown in FIG. 6. In the present embodiment, the base element 102 is optionally adapted to receive a portion of the electrical leads 120; this assists in maintaining the leads in position within the channels 122 during remaining portions of the package manufacturing process prior to encapsulation.

As shown in FIGS. 4 and 6, the raised elements 114 also each include a divider 135 which is used to route the individual conductors 118 away from one another into their respective channels 122. The dividers therefore not only position the conductors 118 during manufacture, but also provide electrical separation. The dividers 135 include a curved or apexed top surface 137 which facilitates separation of the conductors 118. Each divider top surface 137 forms one boundary of its respective aforementioned cavity 116, and acts as a vertical "stop" for the jacketed wire 117 when inserted into the cavity 116.

The base element 102 further includes a plurality of locking notches 140 located in the portion of the sidewall 108 adjacent to and opposite the semicircular recess 126 as shown in FIGS. 2, 3, 4 and 6. These notches 140 are generally semicircular in shape, and guide the jacketed wire 117 into the respective cavity 116 formed by the recess 126 and the sidewall 108. The notches 140 further help maintain the position of the wire 117 relative to the cavity 116 and raised element 114 during subsequent manufacturing steps. Note that other shapes and configurations may be used for the notches 140, including a "V"-shaped notch or even a hole (aperture) through the sidewall 108.

As discussed above, it is also important to maintain a minimum distance between other parts of the assembly and the exposed portion of the conductors 118. It should be noted that the configuration of the base 102 disclosed herein provides a known minimum distance between the exposed portion of the conductors 118 and other parts of the assembly. As previously described, the jacketed wire 117 passes over the sidewall 108 and through the integral locking notch 140. The wall itself provides a minimum path length, for example, 0.020 inches, as shown in FIG. 5. In addition, the wire 117 is also disposed within its respective cavity 116 which in the present embodiment is approximately 0.050 inches deep. The jacket 119 of the wire 117 is stripped such that when the wire 117 is fully inserted into the cavity 116, the jacket 119 touches the top surface 137 of the divider 135. Thus, the distance between the exposed portion of the conductors and the other components of the transformer exceed the aforementioned minimum value of 0.4 mm. Therefore, the use of the locking notches 140 and cavities 116 allow repeatable conformance with the specified standard.

FIG. 6 further illustrates the placement of the jacketed insulated wire 117 and component 104 when installed within the base element 102. Note that in FIG. 6, the outer wall of the raised element 114 is shown transparent for illustrative purposes. As seen in this Figure, the portion of wire 117 enclosed within reinforced jacketing 119 forms a right angle over the locking notch 140 and into the cavity 116. Due to the tendency of the reinforced jacketing 119 to resist deformation, the wire 117 presses against the semicircular recess 126 located on the inner surface of the raised element 114 which creates friction between the recess 126 and the wire 117. The size and depth of the locking notch 140 and cavity 116 are such that a slight interference is caused between the jacket and the recess 126. The cavity 116 is deep enough so that the jacket's resiliency does not permit the wire 117 to inadvertently come out of the cavity 116 during assembly and manufacturing.

Figure 7:
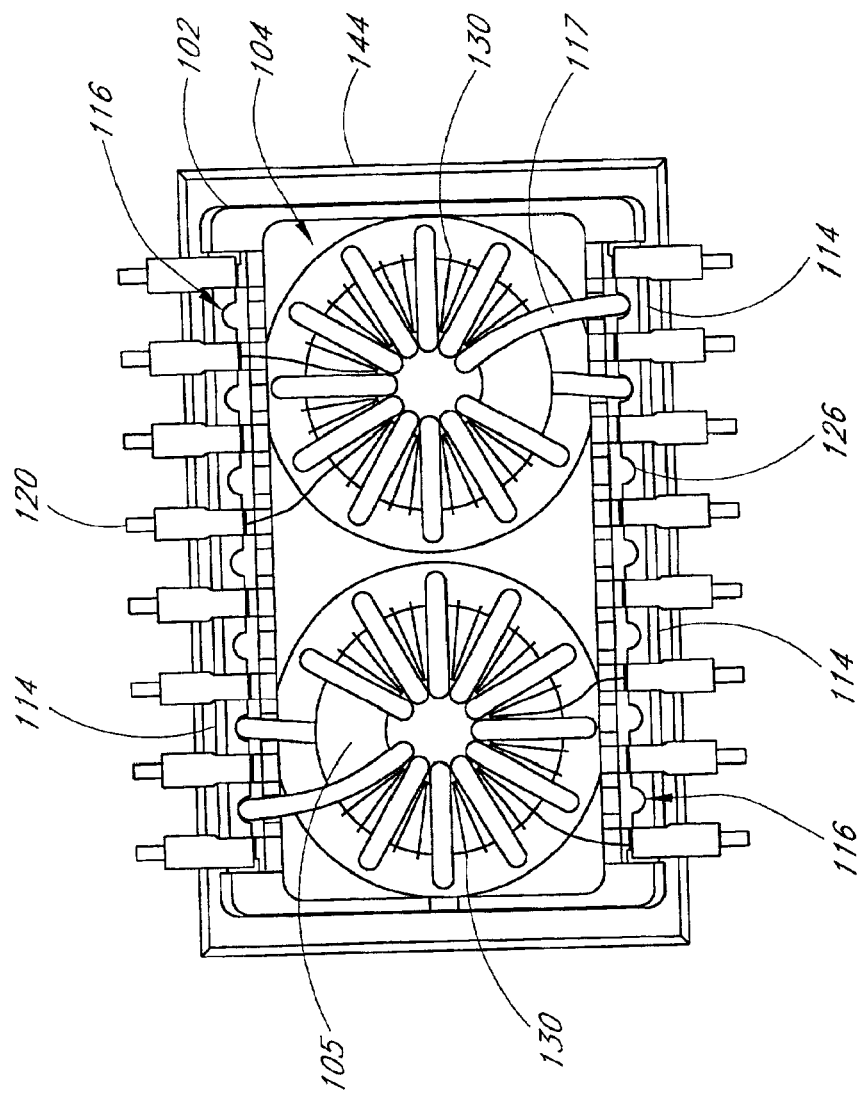
FIGS. 7 through 9 are top, side, and front cutaway views, respectively, of the fully assembled microelectronic component package of FIG. 2 with various portions of the outer encapsulation removed to reveal the internal package components.
Figure 8:
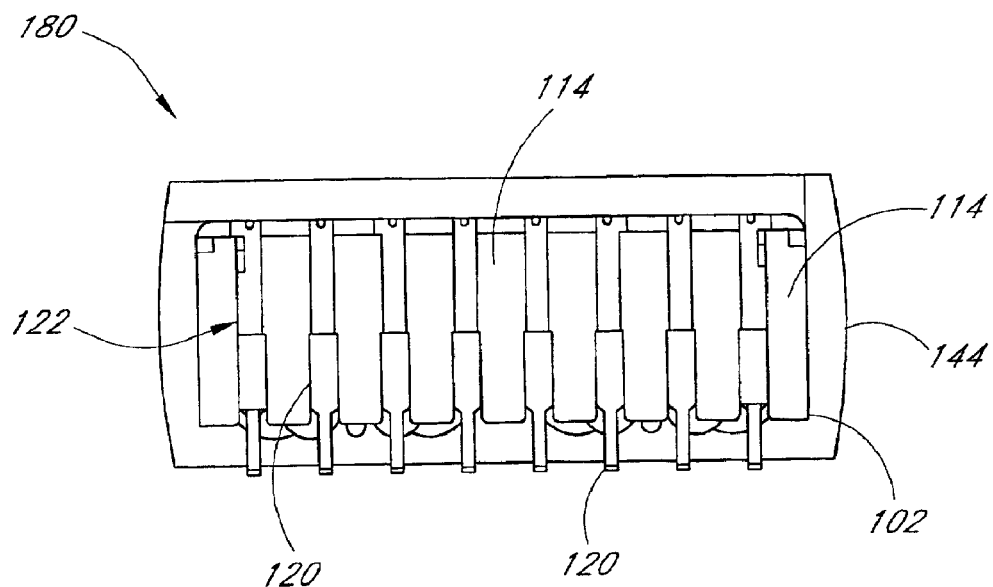
Figure 9:
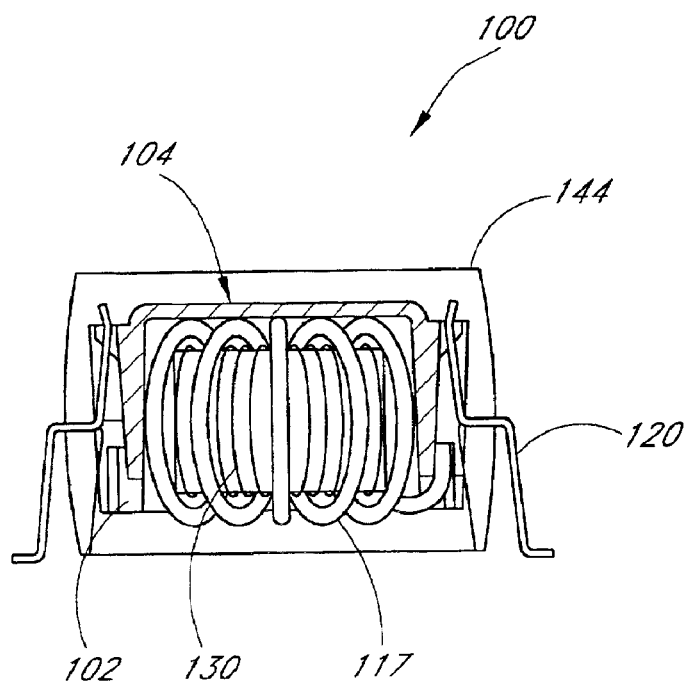

FIGS. 7 through 9 are top, side and end cross-sectional views, respectively, of a fully assembled microelectronic component package according to the present invention comprising two toroid transformers within the base element 102 of FIGS. 3 through 5. In FIGS. 7–9, an overmolding 144 or casing of thermoset epoxy has been transfer molded over the base 102 assembly, leaving only the distal ends 145 of the electrical leads 120 exposed. Overmolding secures the elements permanently in place and provides additional insulation and mechanical protection.

Figure 10:
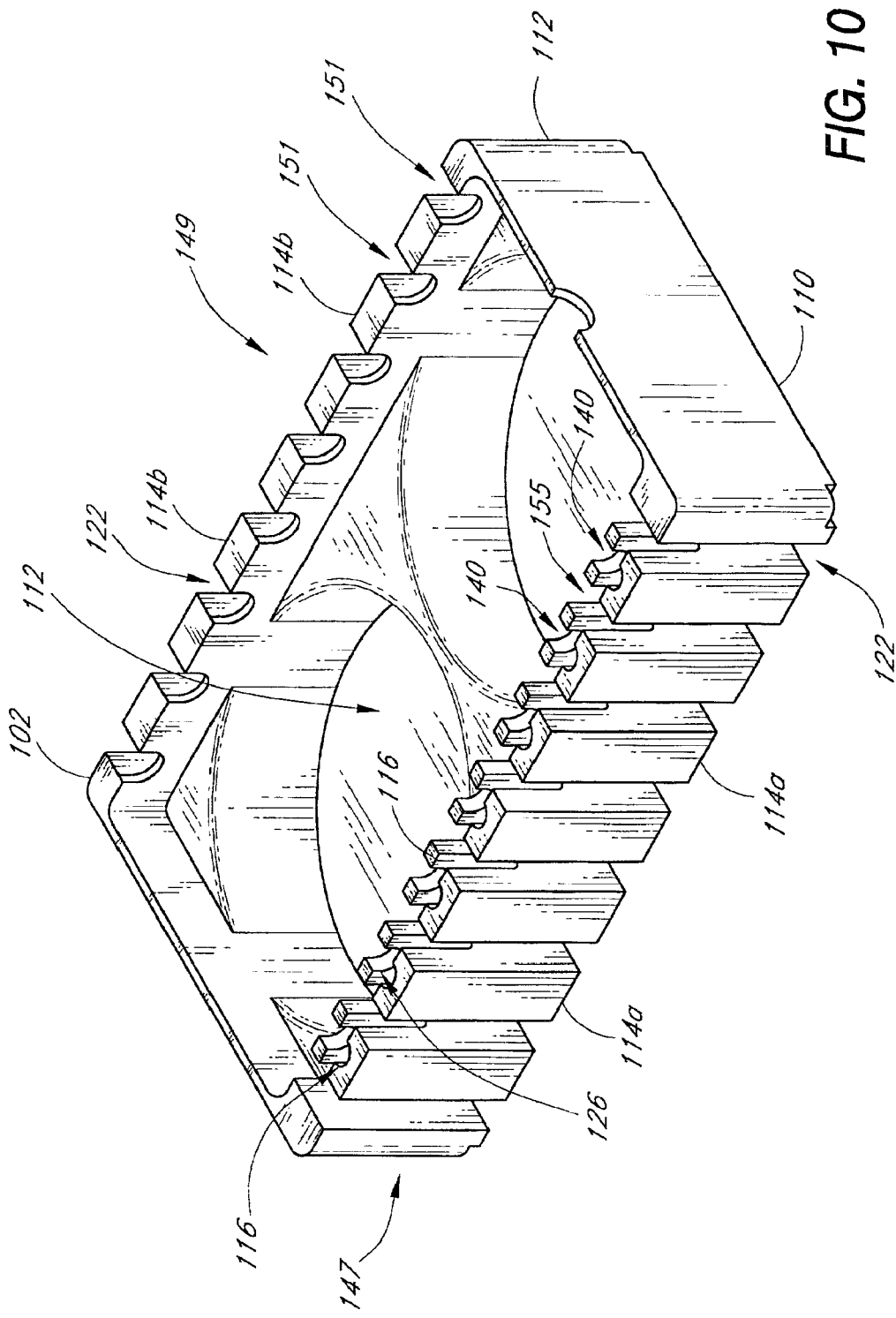
FIG. 10 is a perspective view of a second embodiment of the microelectronic component base of the present invention.

Referring now to FIG. 10, a second embodiment of the component base 102 of the present invention is shown. The embodiment of the base 102 shown in FIG. 10 is similar to that shown in FIGS. 3 through 5, with the exception that raised elements 114a with dividers 135 and cavities 116 (and associated locking notches 140) are only formed on a first side 147 of the base 102. The raised elements 114b on the second side 149 are simply rectangular blocks with no dividers 135, cavities 116, or associated locking notches 140. Note that the second side 149 of the base also includes a series of semicircular notches 151 which allow for passage of the unjacketed wires 130 into the channels 122 formed by the raised elements 114b.

Figure 11:
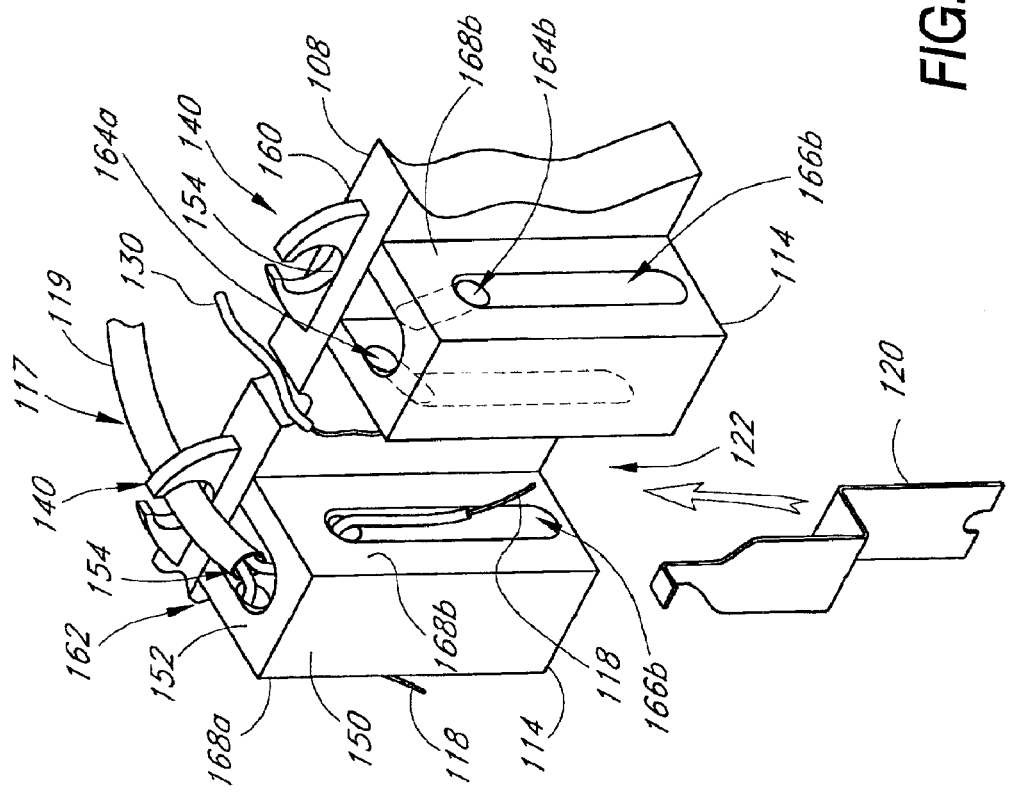
FIG. 11 is a partial perspective of a portion of a third embodiment of the microelectronic component base of the present invention.

Referring now to FIG. 11, a third embodiment of the component base of the present invention is illustrated. The component base 102 of FIG. 11 includes a series of raised elements 114 similar to the embodiment of FIG. 2. However, in the embodiment of FIG. 11, the raised elements are comprised essentially of solid rectangular "blocks" 150 which are formed into the sidewall 108, as opposed to the outer wall/divider arrangement previously described in connection with FIGS. 2 through 6. The rectangular blocks 150 accomplish routing of the wire 117 and associated conductors 118 by use of a recess and bore arrangement. Specifically, the top surface 152 of each block includes a recess 154 of semicircular cross-section which extends from the inner surface 160 of the sidewall 108 to a generally central point 162 in the top surface 152 of the block. Two or more bores 164a, 164b are located in the block 150 at oblique angles with respect to vertical, and communicate with the recess 154 at one end. As further illustrated in FIG. 11, two additional side recesses 166a, 166b are located in the side surfaces 168a, 168b of each block 150 which communicate with the other end of the bores 164a, 164b, respectively to receive the electrical conductors 118 routed therethrough. When assembled, the jacketed wire 117 is retained by its respective the locking notch 140 and routed into the top surface recess 154. At the outermost terminus of the top surface recess 154, the jacketing 119 is removed from the wire 117, and the individual conductors 118 further routed through the bores 164a, 164b and into the side recesses 166a, 166b and ultimately into their respective channel 122 where the conductors 118 can be electrically connected to the electrical lead 120 and the unjacketed wire 130 (also routed into the channel).

Figure 12:
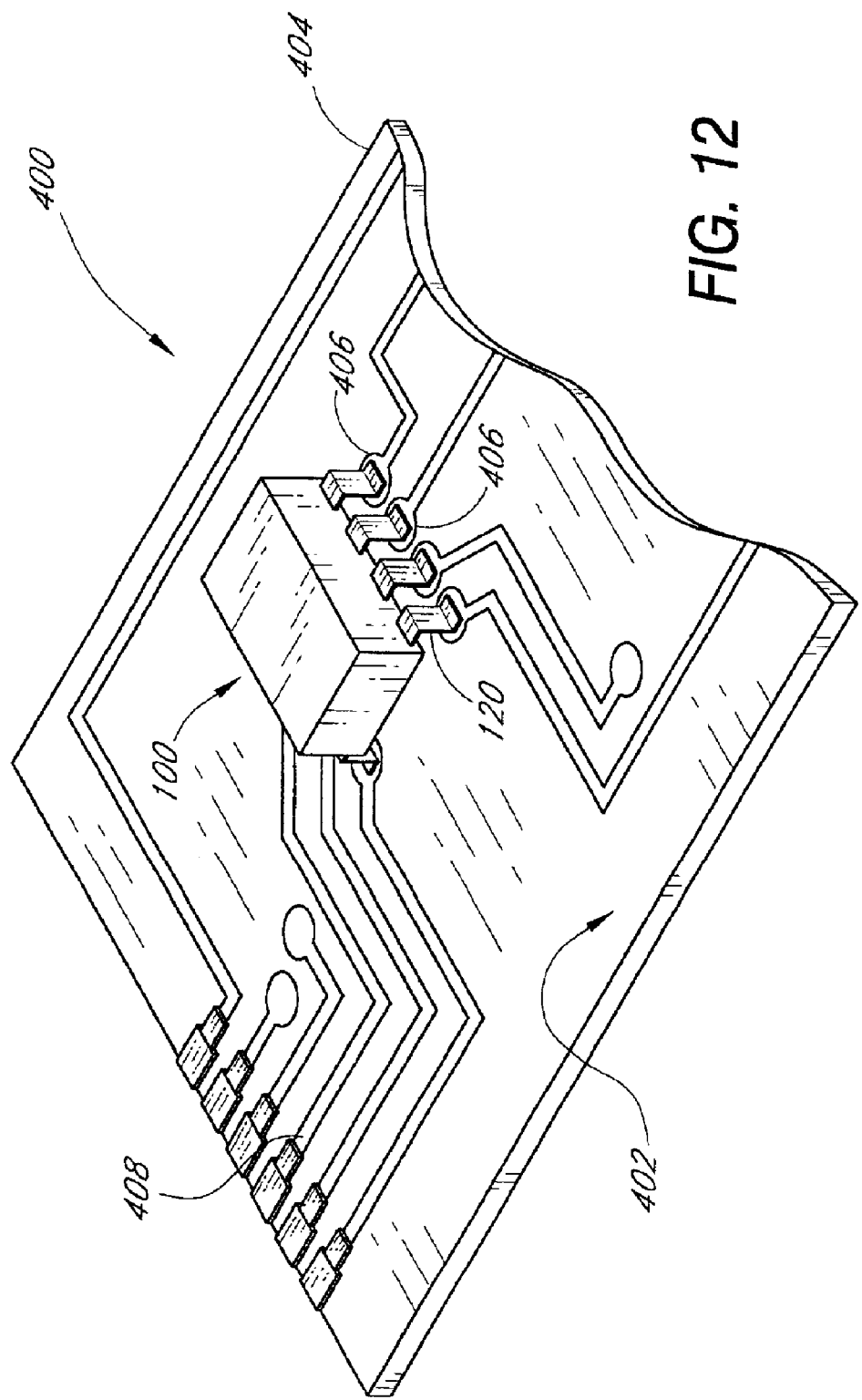
FIG. 12 is perspective view of a portion of a circuit board incorporating the microelectronic component package of the present invention.

Referring now to FIG. 12, a circuit board assembly 400 incorporating the microelectronic component package 100 of the present invention is described. As shown in FIG. 12, a component package 100 is disposed upon at least one surface 402 of the circuit board 404 such that the electrical leads 120 of the package are in electrical contact with corresponding contact elements 406 on the circuit board 404. The circuit board 404 of the present embodiment is a multi-layer board having a plurality of conductive strips 408, vias (not shown), and contact elements 406 of the type well known and commonly used in the electronic arts. It can be appreciated, however, that any type of circuit board which allows for the interchange of electrical signals to and from component package may be used. In the present embodiment, a standard eutectic solder (such as 63% lead and 37% tin) is used to establish a permanent bond between the electrical leads 120 of the package and the contact elements 406 of the board, although other bonding agents may be used. It will further be recognized that a plurality of component packages 100 may be mounted to either side of the board 404 as needed.

Method of Manufacture

Figure 13:
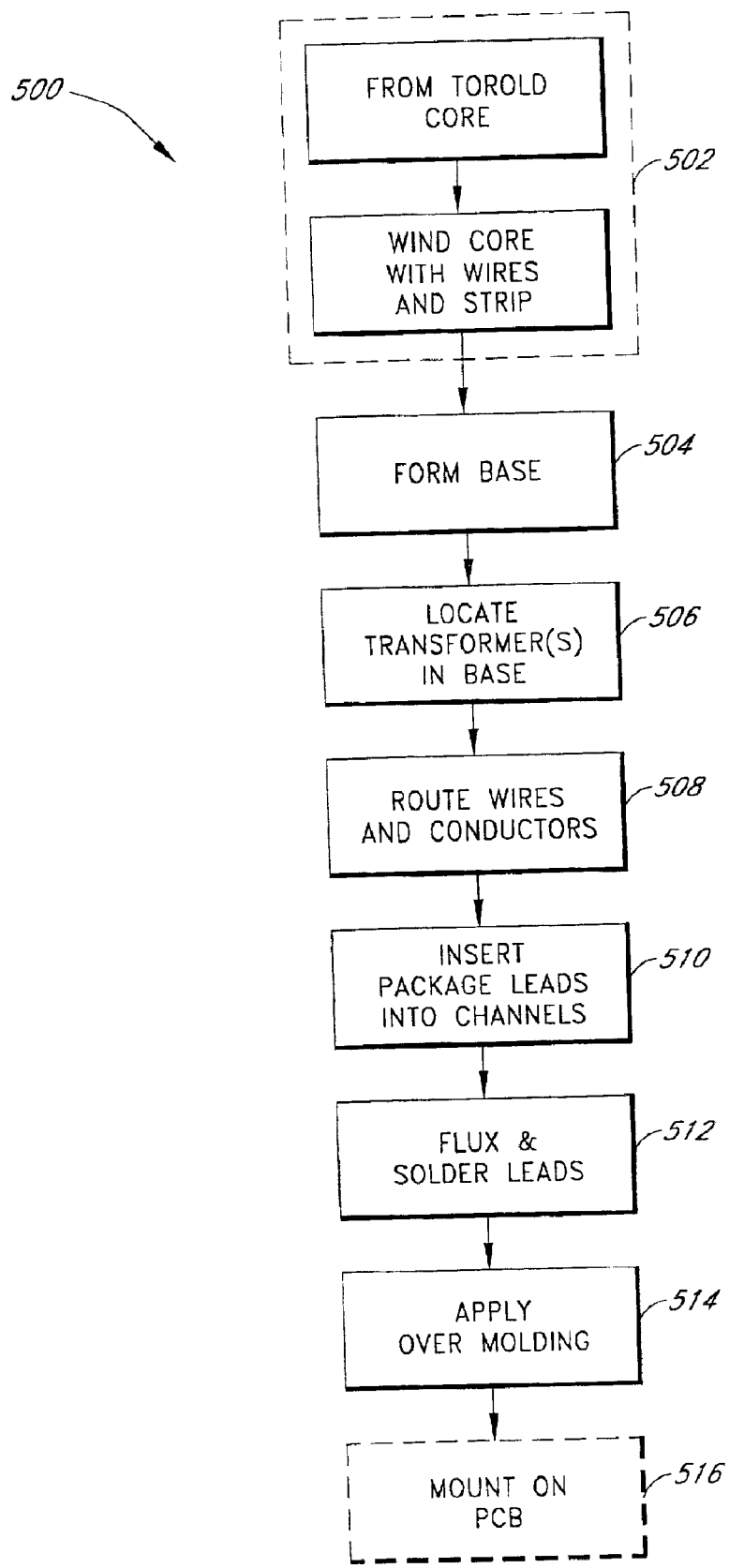
FIG. 13 is a flow diagram illustrating a first embodiment of the manufacturing process of the present invention.

Referring now to FIG. 13, a method 500 of manufacturing the aforementioned microelectronic component package, including the circuit board assembly, is described in detail.

In the first step 502, one or more microelectronic components are fabricated. For example, the aforementioned transformers are fabricated using a series of process steps, including fabrication of the core and winding of the insulated conductors thereon, which are well known in the art. The toroidal core 105 of the exemplary transformers is formed and subsequently wound with the jacketed wire 117 and the unjacketed wire 130 to provide the desired electrical characteristics. In the present embodiment of the method 500, the jacketing 119 of the jacketed wire 117 is stripped as previously described such that the jacketing 119 roughly coincides with the top surface 137 of its respective raised element divider 135. It will be appreciated, however, that the jacket may also be stripped prior to winding around the core 105 if desired, or even after the component 104 is disposed into the base 102 (see discussion of the third step 506 below).

Next, in the second process step 504, the component base 102 as previously described herein is formed preferably using an injection molding process of the type well known in the polymer arts. Note that this second step 504 can be performed either prior to, after, or in parallel with the first step 502.

In the third process step 506, the microelectronic component(s) 104 fabricated in the first process step 502 are disposed within the recess(es) 112 the base element 102 using mechanical or manual means. Ideally, a small bead of silicone is placed in the bottom of each recess 112 or surrounding the component 104 to temporarily affix the respective component 106 to the base 102.

Next, the jacketed wire 117 of the microelectronic component 106 is routed into the appropriate notch 140 on the sidewall 108 of the base 102 and inserted into the respective cavity 116. The individual conductors 118 of the wire are also routed around the raised elements 114 and into their respective channels 122 in this fourth process step 508.

Also as part of the process step 508, the unjacketed wires 130 from the component 106 are routed via the sidewall interstices 155 into their respective channels 122 to ultimately permit electrical connection to the package leads 120 and the exposed portion of the wire conductors 118. The unjacketed wires 130 are bent into the lead channels 122 and, thus, held in place by conductor's retention of the preformed shape. The ends of the unjacketed wires 130, and individual conductors 118, are further sized and trimmed such that they roughly coextensive and extend no further than the bottom surface 110 of the base element 102.

In the next process step 510, the package electrical leads 120 are inserted into the channels 122 and placed in physical contact with the exposed portion of the conductors 118 and the unjacketed wire 130. This step 510 is typically accomplished using a preformed leadframe (not shown) such that all of the package leads 120 may be placed and trimmed substantially simultaneously, although other methods may be used. Fabrication and placement of the leadframe is further discussed in U.S. Pat. No. 5,015,981, incorporated herein by reference.

In the next process step 512, the bottom surface 110 of the assembly is dipped partially into a flux and then into a eutectic solder pot to form a solder joint between the package leads 120, the exposed portion of the conductors 118 of the jacketed wire 117, and the unjacketed wire 130. Insulation present on the ends of the wires 130 and conductors 118 is melted and stripped away immediately by the heat of the flux/solder process.

In process step 514, polymer overmolding 144 is applied which encapsulates the assembly and completes the package. The details of these processes are discussed in the previously described U.S. Pat. No. 5,015,981 incorporated by reference herein.

In an optional process step 516, the assembled package 100 is positioned atop a printed circuit board 404 as shown in FIG. 12, and the package leads 120 are soldered to the contact elements 406 of the circuit board to form a permanent electrical connection. Any number of solder or bonding processes may be used to join the package leads 120 to the contact elements 406; soldering using a eutectic solder as described herein is merely illustrative of these methods.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A method of manufacturing a microelectronic component package composing:

providing a microelectronic component having a plurality of individual conductors;

forming a component base having at least one sidewall, at least one internal recess, said recess adapted to at least partially receive said microelectronic component, and a plurality of raised elements, said raised elements mounted at least partially on said at least one sidewall, adjacent ones of said raised elements forming channels defined by said adjacent raised elements and said sidewall, said raised elements further defining a cavity for at least partly receiving said conductors;

disposing said microelectronic component within said internal recess of said component base such that pairs of said individual conductors are disposed at least partially within respective ones of said cavities;

routing individual conductors of said pairs in respective ones of said channels so as to provide electrical separation between said conductors;

inserting electrical leads into respective ones of said channels; and forming an electrical connection between said leads and respective ones of said individual conductors.

2. The method of claim 1, wherein said microelectronic component is a transformer.

3. The method of claim 1, wherein the act of forming a component base includes the formation of four sidewalls and a top surface.

4. The method of claim 1, wherein the act of forming a component base includes forming more than one recess.

5. The method of claim 1, wherein each of said plurality of conductors of said microelectronic component are insulated.

6. The method of claim 1, wherein at least two of said plurality of conductors are jacketed for at least part of their length after the conductors are insulated.

7. The method of claim 6, wherein said method further comprises removing said jacket during manufacturing.

8. The method of claim 1, wherein the act of forming an electrical connection between said electrical leads and said conductors includes soldering at least one conductor to at least one electrical lead.

* * * * *

UNITED STATES PATENT AND TRADEMARK OFFICE
CERTIFICATE OF CORRECTION

PATENT NO. : 6,877,211 B2
DATED : April 12, 2005
INVENTOR(S) : Russell Lee Machado It is certified that error appears in the above-identified patent and that said Letters Patent is hereby corrected as shown below:

Column 10,
Line 23, delete "composing" and insert -- comprising -- therefor.

Signed and Sealed this

Eighth Day of November, 2005

JON W. DUDAS
*Director of the United States Patent and Trademark Office*